United States Patent [19]

Watanabe

[11] Patent Number: 5,284,547
[45] Date of Patent: Feb. 8, 1994

[54] PLASMA-PROCESS SYSTEM WITH BATCH SCHEME

[75] Inventor: Masahide Watanabe, Kofu, Japan

[73] Assignee: Tokyo Electron Limited, Tokyo, Japan

[21] Appl. No.: 818,524

[22] Filed: Jan. 9, 1992

[30] Foreign Application Priority Data

Jan. 22, 1991 [JP] Japan .................................. 3-22770

[51] Int. Cl.⁵ .......................... B01J 19/00; B01L 5/00
[52] U.S. Cl. .................... 156/626; 156/643;
  156/646; 156/345; 427/8; 118/712
[58] Field of Search .............. 156/626, 345, 646, 643;
  204/298.31, 298.33, 298.34; 118/712, 723;
  427/8

[56] References Cited

U.S. PATENT DOCUMENTS

| | | | |
|---|---|---|---|
| 3,406,510 | 8/1969 | Currin | 118/725 X |
| 4,304,983 | 12/1981 | Pierfederici | 156/646 X |
| 4,362,632 | 12/1982 | Jacob | 156/345 X |
| 4,430,151 | 2/1984 | Tsukada | 156/626 |
| 4,491,499 | 1/1985 | Jerde et al. | 156/626 |
| 4,609,426 | 9/1986 | Ogawa et al. | 156/626 |
| 4,786,352 | 11/1988 | Benzing | 156/345 |
| 4,812,201 | 3/1989 | Sakai et al. | 156/643 |
| 4,872,944 | 10/1789 | Rufin et al. | 156/626 |
| 4,989,540 | 2/1991 | Fuse et al. | 118/725 X |
| 5,099,100 | 3/1992 | Bersin et al. | 156/345 X |

FOREIGN PATENT DOCUMENTS 56-115536  9/1981 Japan .
56-165327 12/1981 Japan .

OTHER PUBLICATIONS

Daley et al, "Determining the Etching End Point of Photoresist during Reactive Ion Etching", IBM Technical Disclosure Bulletin, vol. 20, No. 11B, Apr. 1978.

Primary Examiner—Thi Dang
Attorney, Agent, or Firm—Oblon, Spivak, McClelland, Maier & Neustadt

[57] ABSTRACT

Ashing or etching is performed in a plasma surface-process apparatus and, e.g., a CO concentration of a discharge gas from the apparatus is monitored by a CO monitor. Since the generated CO concentration is correlated to a surface processing speed, an end point of surface processing can be detected by obtaining a CO concentration at the end point of surface processing in advance. When the state of the apparatus negatively changes, the plasma discharge state is changed, and, e.g., the generated CO concentration is also changed. The state of the apparatus can be obtained by monitoring the CO concentration. The plasma surface-process apparatus prevents the plasma from flowing into an inner chamber of a reaction chamber and allows only radicals generated by plasma discharge to flow into it, so that plasma processing can be effectively performed.

15 Claims, 6 Drawing Sheets

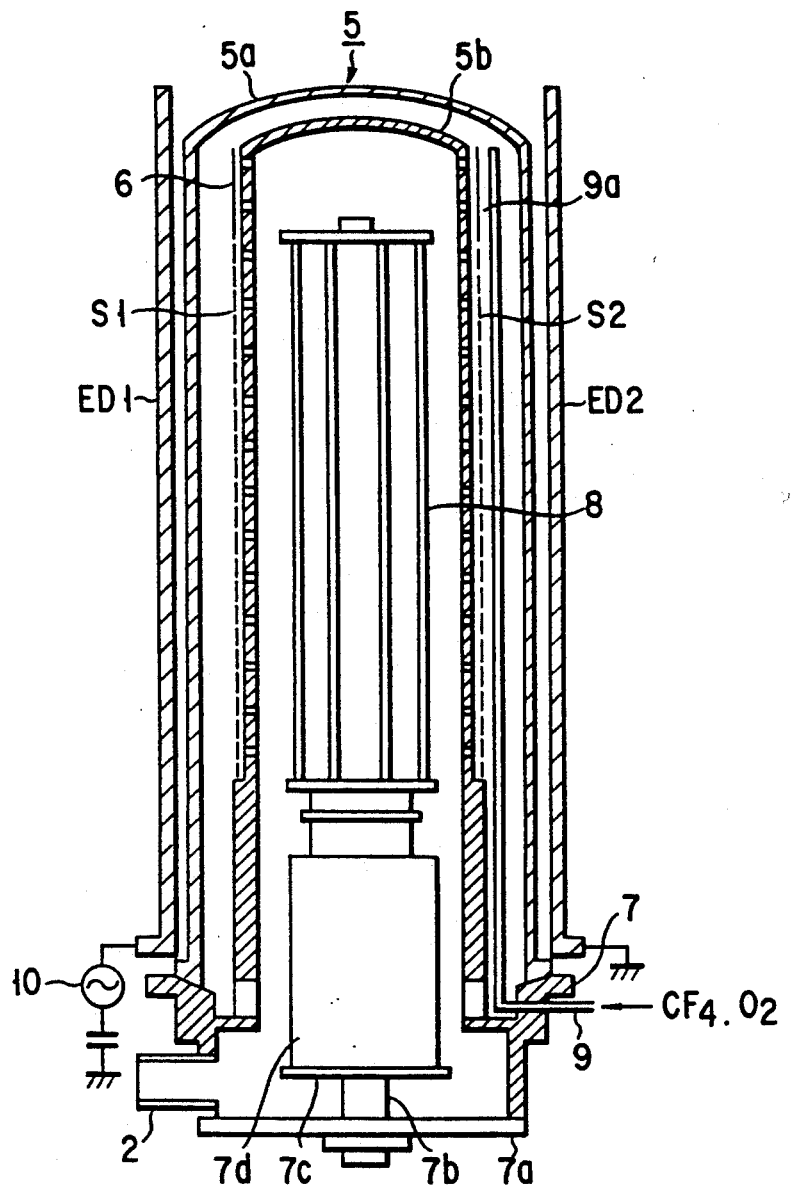
F I G. 2

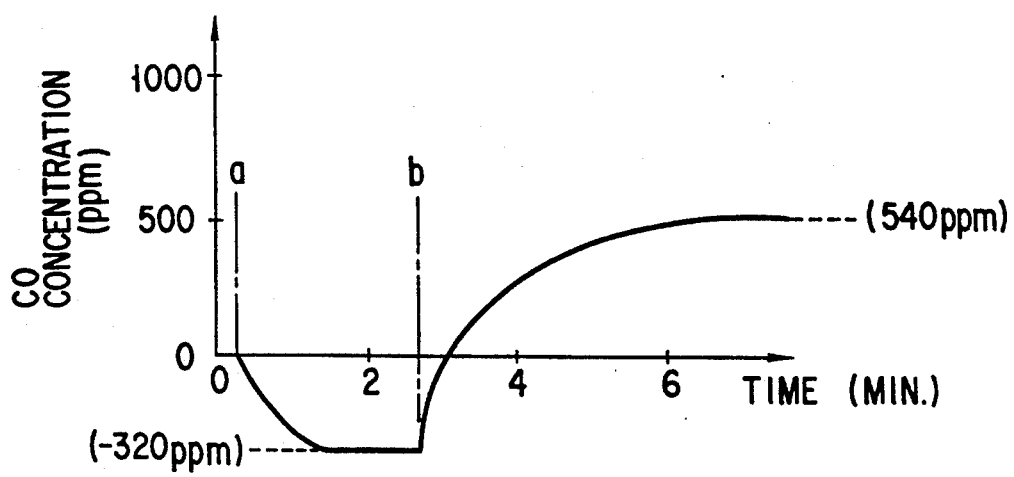
F I G. 8
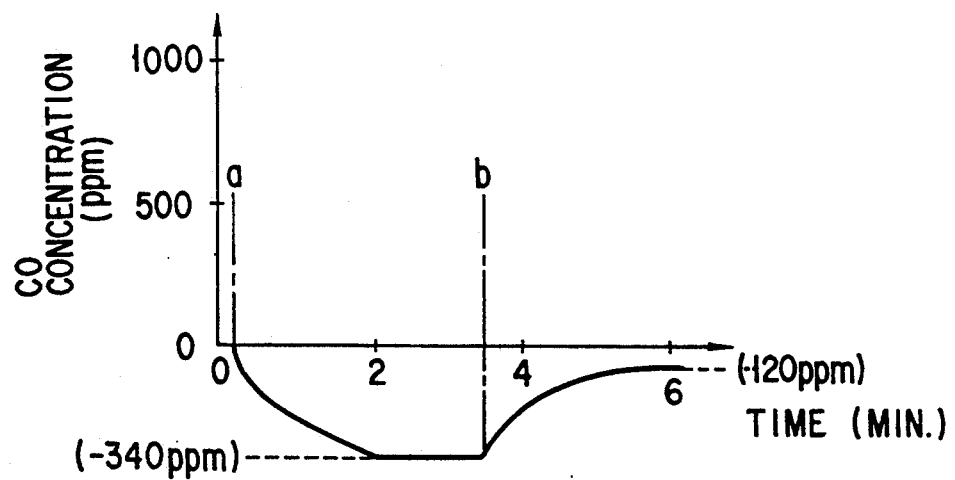
F I G. 9

PLASMA-PROCESS SYSTEM WITH BATCH SCHEME

BACKGROUND OF THE INVENTION

1. Field of the Invention

The present invention generally relates to a plasma-process system and, more particularly, to a plasma-process system including a plasma surface-process apparatus with a batch scheme for simultaneously surface-processing a plurality of semiconductor wafers and a method of detecting an end point of plasma surface processing and monitoring a state of plasma surface processing.

2. Description of the Related Art

In the LSI manufacturing process, a thin film formed on a semiconductor wafer is sometimes surface-processed by using a plasma. For example, ashing of an organic thin film by using a plasma is widely employed in the resist removing step. Etching using a plasma is an indispensable technique in etching a micropattern of an integrated circuit.

An ashing rate and an etching rate change depending on various factors, e.g., a resist or etching material, a sample temperature, and process conditions. Although precise time control is not needed in ashing, when the sample is excessively exposed to a plasma, the sample is denatured, e.g., radiation damage or oxidation occurs. Therefore, it is required to detect an end point of ashing. An end point of etching needs to be accurately detected since etching exposes an underlying layer, e.g., an impurity layer, by removing an unnecessary portion such as an oxide film.

For these reasons, conventionally, a method of detecting an end point of ashing by utilizing the correspondence between the intensity of an interference wave, caused by light reflected by a photoresist surface and light reflected by a substrate surface, and a film thickness of the resist, and by measuring the intensity of the interference wave, a method of detecting a sharp change in light spectrum at, e.g., an end point of etching, as described in Published Unexamined Japanese Patent Application No. 56-115536, a method of detecting fluorescence, a method of directly visually observing a plasma and measuring it, and a method of detecting a gas pressure in a reaction chamber, as described in Published Unexamined Japanese Patent Application No. 56-165327, have been performed. To perform such surface processing, the state of surface processing needs to be monitored. In this case, the processing is actually performed and the end point of the processing is determined depending on the processing state. Alternatively, an optical method or visual observation of a plasma, as described above, is performed.

However, the method of optically monitoring the plasma requires optical equipment such as a spectroscope, resulting in a complicated, expensive apparatus which is cumbersome to operate. The method of visual plasma observation lacks reliability as it requires a certain degree of experience and perception. In addition, the observation keeps the operator bound to the apparatus and is thus inconvenient. The method of grasping the state of the apparatus by actually performing processing sometimes wastes an object to be processed. The method of detecting the gas pressure in the reaction chamber complicates the apparatus since a vacuum gauge must be incorporated in the reaction chamber. Also, the vacuum gauge may be deteriorated by the plasma.

To perform surface processing such as ashing and etching as described above, the plasma-process apparatus with a batch scheme is employed in which a plurality of semiconductor wafers are placed on a so-called wafer boat and are simultaneously plasma-processed. This plasma-process apparatus needs to perform end point detection, state monitoring, and plasma processing itself as effectively as possible.

SUMMARY OF THE INVENTION

It is, therefore, an object of the present invention to provide a new and improved plasma-process method in which detection of an end point of surface processing and state monitoring of a surface-process apparatus can be performed with a simple structure and an easy operation at a low cost.

It is another object of the present invention to provide a plasma-process apparatus in which plasma processing can be effectively performed with a simple structure and a simple operation.

According to a first aspect of the present invention, there is provided a plasma-process method, comprising the steps of:

generating a gas plasma by causing a predetermined gas and a predetermined high-frequency electric field to react with each other in a processing chamber for housing an object to be processed;

discharging a gas from the processing chamber while executing plasma processing of the object to be processed by the gas plasma; and monitoring a concentration of a specific gas component, of gas components contained in the gas discharged from the processing chamber, which is generated by plasma processing of the object to be processed.

According to a second aspect of the present invention, there is provided a plasma-process apparatus, comprising:

plasma generating means for generating a gas plasma by causing a predetermined gas and a predetermined high-frequency electric field to react with each other in a processing chamber for housing an object to be processed;

discharging means for discharging a gas from the processing chamber while executing plasma processing of the object to be processed by the gas plasma generated by the plasma generating means; and monitoring means for monitoring a concentration of a specific gas component, of gas components contained in the gas discharged from the processing chamber by the discharging means, which is generated by plasma processing of the object to be processed.

According to a third aspect of the present invention, there is provided a plasma-process apparatus, comprising:

a processing chamber having a double structure of outer tube and inner tube having open ends corresponding to each other, the inner tube having a plurality of holes formed at a plurality of positions equally dividing an entire circumference of the inner tube, and the processing chamber being provided with an etch tunnel member which covers an outer circumferential surface of the inner tube and which has a plurality of holes formed at positions offset from the positions of the plurality of holes formed in the inner tube;

manifold means for holding the openings of the outer tube and the inner tube of the processing chamber and a housing member for an object to be processed which is to be inserted in the processing chamber, the manifold means being provided with discharging means for discharging a gas from the processing chamber;

injector means for supplying a gas for plasma generation between the outer tube and the inner tube of the processing chamber;

a pair of electrode means, provided to surround an outer circumference of the outer tube, for generating a gas plasma by causing a predetermined high-frequency electric field to react with the gas for plasma generation which is supplied between the outer tube and the inner tube, thereby inducing plasma processing of the object to be processed which is inserted in the inner chamber; and monitoring means for monitoring a state of progress of plasma processing of the object to be processed in relation to plasma processing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a view showing a plasma surface-process apparatus shown in FIG. 1 according to a embodiment of the present invention;

FIG. 8 is a graph indicating a CO concentration upon plasma discharge when the apparatus shown in FIG. 6 is used; and FIG. 9 is a graph indicating a CO concentration upon plasma discharge when the apparatus shown in FIG. 7 is used.

DETAILED DESCRIPTION OF THE PREFERRED EMBODIMENTS

Figure 1:
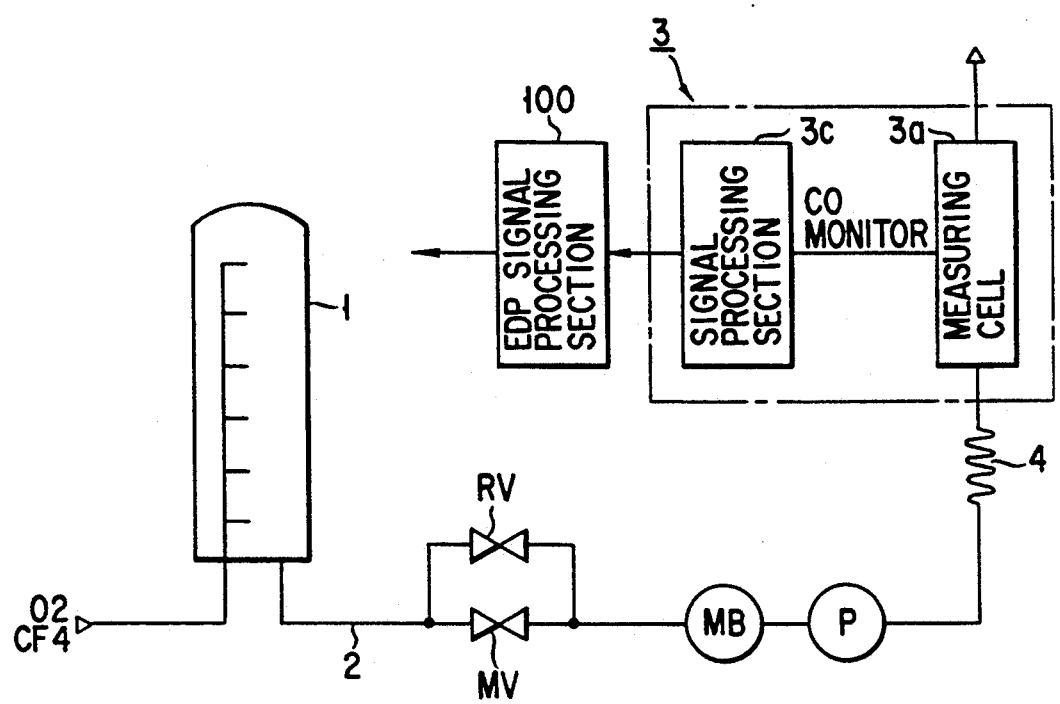
FIG. 1 is a block diagram showing an arrangement of a system for practicing an embodiment of the present invention.

Reference will now be made in detail to the presently preferred embodiments of the invention as illustrated in the accompanying drawings, in which like reference characters designate like or corresponding parts throughout the several drawings.

The outline of the present invention will be described.

A specific gas concentration of a discharge gas is associated with a state of surface processing and a plasma discharge state. The gas concentration of the discharge gas can be precisely measured since a vacuum pump for drawing the discharge gas in a reaction chamber by vacuum is of a dry type. The present invention has been made on the basis of these facts. More specifically, the characteristic feature of an aspect of the present invention resides in that an end point of plasma surface processing is detected by monitoring the concentration of a gas generated by surface processing and contained in the discharge gas from the reaction chamber.

The characteristic feature of another aspect of the present invention resides in that a state of plasma surface-process apparatus is monitored by monitoring a concentration of a gas generated during plasma generation.

When an object to be processed is surface-processed by using a plasma, a gas such as CO is generated. The concentration of the generated gas is correlated to a surface processing rate. Accordingly, for example, a change in concentration of a generated gas in a discharge gas from the reaction chamber is recorded in advance to obtain a gas concentration corresponding to the end point of surface processing. When the actual concentration of the generated gas reaches this value, it is determined that an end point is reached.

A gas such as CO is generated not only when surface processing is performed but also when a plasma is generated without an object to be processed in the reaction chamber. The amount of generated gas corresponds to the state of the apparatus. When a plasma is generated, the concentration of a gas, e.g., CO in the discharge gas is monitored regardless of whether surface processing is performed. The monitored gas concentration is compared with the recorded data, thereby monitoring whether the state of the apparatus is normal or not.

Preferred embodiments of the present invention based on the above outline will be described.

FIG. 1 shows an arrangement of a system for practicing the method of the present invention.

Referring to FIG. 1, reference numeral 1 denotes a plasma surface-process apparatus for ashing or etching, e.g., a semiconductor wafer as an object to be processed.

In a discharge path 2 for discharging a gas from the surface-process apparatus 1, a main valve MV and a sub valve RV are connected in parallel to each other, a mechanical booster pump MB, and a vacuum dry pump P are provided in the order named from the apparatus 1 side. A CO monitor 3 which utilizes, e.g, infrared absorption for monitoring the concentration of a gas, e.g., carbon monoxide, generated by surface processing, e.g., ashing, is connected to the discharge side of the pump P through a flexible pipe 4. Reference numerals 3a and 3c denote a measuring cell and a signal processing section, respectively, which will be described later. Reference numeral 100 denotes an end point detection (EDP) signal processing section which comprises a CPU and the like.

The arrangement of the surface-process apparatus 1 will be described with reference to FIG. 2. A reaction chamber 5 comprises, e.g., a quartz outer tube 5a and, e.g., a quartz inner tube 5b arranged in the outer tube 5a at a gap to be concentric with it.

A plurality of holes S1 each having a diameter of 2 mm are vertically formed in the inner tube 5b at four portions equally dividing the entire circumference of the inner tube 5b into four parts. An aluminum cover 6 is provided to cover the outer circumferential surface of the inner tube 5b. The aluminum cover 6 has a plurality of etch tunnels S2 formed at portions offset from the holes S1. Thus, a generated plasma (to be described later) itself is prevented from flowing into the inner tube 5b, and only the radicals generated by the plasma are allowed to flow into the inner tube 5b. In other words, since the radicals react with the semiconductor wafer as the object to be processed (to be described later) in the inner tube 5b, plasma processing can be effectively performed.

The outer and inner tubes 5a and 5b are held by, e.g., a stainless steel cylindrical manifold 7 at their lower ends. The manifold 7 is fixed on a base plate (not shown). A disc-shaped cap member 7a is provided on an opening portion at a lower end portion of the manifold 7 to be capable of opening/closing the opening portion. A rotating shaft 7b which is driven by a rotating mechanism (not shown) is inserted in a substantially central portion of the cap member 7a to be airtight by, e.g., magnetic seal. A turntable 7c is fixed on an upper end of the rotating shaft 7b. A heat-insulating quartz cylinder 7d is arranged on an upper surface of the turntable 7c. For example, a quartz wafer boat 8 is mounted on the heat-insulating cylinder 7d. The wafer boat 8 holds, e.g., 66 semiconductor wafers stacked at a predetermined gap, e.g., 4.76 mm to be substantially parallel with each other. The wafer boat 8 is loaded in and unloaded from the reaction chamber 5 by a convey mechanism (not shown) together with the cap member 7a and the heat-insulating cylinder 7d.

An injector 9 is hermetically and horizontally inserted in a side surface of the manifold 7. The inner end side of the injector 9 is bent in an L-shaped manner to vertically extend upward between the outer chamber 5a and the aluminum cover 6. A plurality of gas flow holes 9a are formed in the upright pipe portion of the injector 9 vertically at a predetermined pitch. A gas source (not shown) for supplying, e.g., a Freon ($CF_4$) gas or oxygen ga for generating the plasma is connected to the outer end side of the injector 9.

The discharge path 2 for setting the interior of the reaction chamber 5 at a predetermined reduced pressure atmosphere by discharging the processing gas in the reaction chamber 5 is connected to the side surface of the manifold 7.

A pair of electrodes ED1 and ED2 each having an arcuated section are arranged outside the outer tube 5a at a gap to surround it. The electrode ED1 is connected to a high-frequency power supply 10, and the other electrode ED2 is grounded.

The arrangement and measuring principle of the CO monitor 3 shown in FIG. 1 will be described with reference to FIG. 3.

Figure 3:
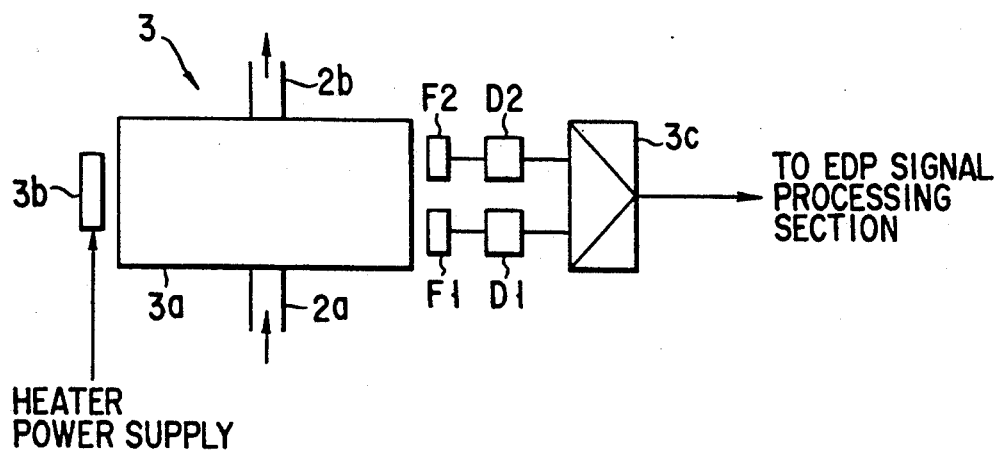
FIG. 3 is a block diagram of a CO monitor shown in FIG. 1.

Referring to FIG. 3, reference numeral 3a denotes the measuring cell. Discharge pipes 2a and 2b each constituting the discharge path 2 are connected to the upper and lower surfaces of the measuring cell 3a so that the discharge gas from the vacuum dry pump P constantly flows in the measuring cell 3a.

An infrared ray from a light-emitting section 3b, provided on one side surface of the measuring cell 3a and comprising a ceramic heater or the like, directly passes through the cell 3a without changing its energy if a gas having an infrared absorption property is not present in the cell 3a. If a measurement target gas or a coexisting gas is present in the cell 3a, the infrared ray is absorbed by the gas in accordance with the gas concentration at the corresponding wavelength. Accordingly, when transmitting wavelengths of two optical filters F1 and F2 opposing the light-emitting section 3b are selected to obtain an output corresponding to a change in concentration of the target gas from one detecting section D1 and an output not related to the change in concentration of the target gas and the coexisting gas from the other detecting section D2, and when a difference between the two outputs is obtained by the signal processing section 3c comprising a differential amplifier or the like, an output corresponding to the change in concentration of the target gas can be obtained without being influenced by a temperature change. Since the CO monitor 3 described above is an in-line monitor which measures the concentration by constantly causing the discharge gas to pass through the measuring cell 3a, it is free from a time lag unlike in sampling, thereby accurately detecting the processing state in the reaction chamber 5.

The operation of the system described above will be described.

First, the wafer boat 8 holding e.g., 66 semiconductor wafers therein is loaded in the reaction chamber 5 by a convey mechanism (not shown). Then, the interior of the reaction chamber 5 is evacuated to, e.g., a vacuum degree of $1 \times 10^{-3}$ by primary and secondary combinations of the respective pumps MB and P and the respective valves MV and RV. The Freon gas and the oxygen gas are supplied through the injector 9 at the flow rates of 160 SCCM and 800 SCCM, respectively, to cause a gas mixture thereof to inject from the gas flow holes 9a in the injector 9. A high-frequency voltage of, e.g., a power of 1 kW and a frequency of 13.56 MHz is applied across the electrodes ED1 and ED2 by the high-frequency power supply 10 at room temperature to generate the plasma of the gas mixture. The interior of the reaction chamber 5 is evacuated while controlling its pressure at 0.2 Torr. Ashing is performed for, e.g., a novolac-based resist film of the semiconductor wafers placed in the wafer boat 9.

The discharge gas absorbed by the vacuum dry pump P is guided to the measuring cell 3a of the CO monitor 3 to monitor the CO concentration of the discharge gas by the EDP signal processing section 100 through the signal processing section 3a. When the measured concentration has decreased to a predetermined value (e.g., 70%), it is determined that ashing is completed, and this information is supplied to the respective sections described above.

Figure 4:
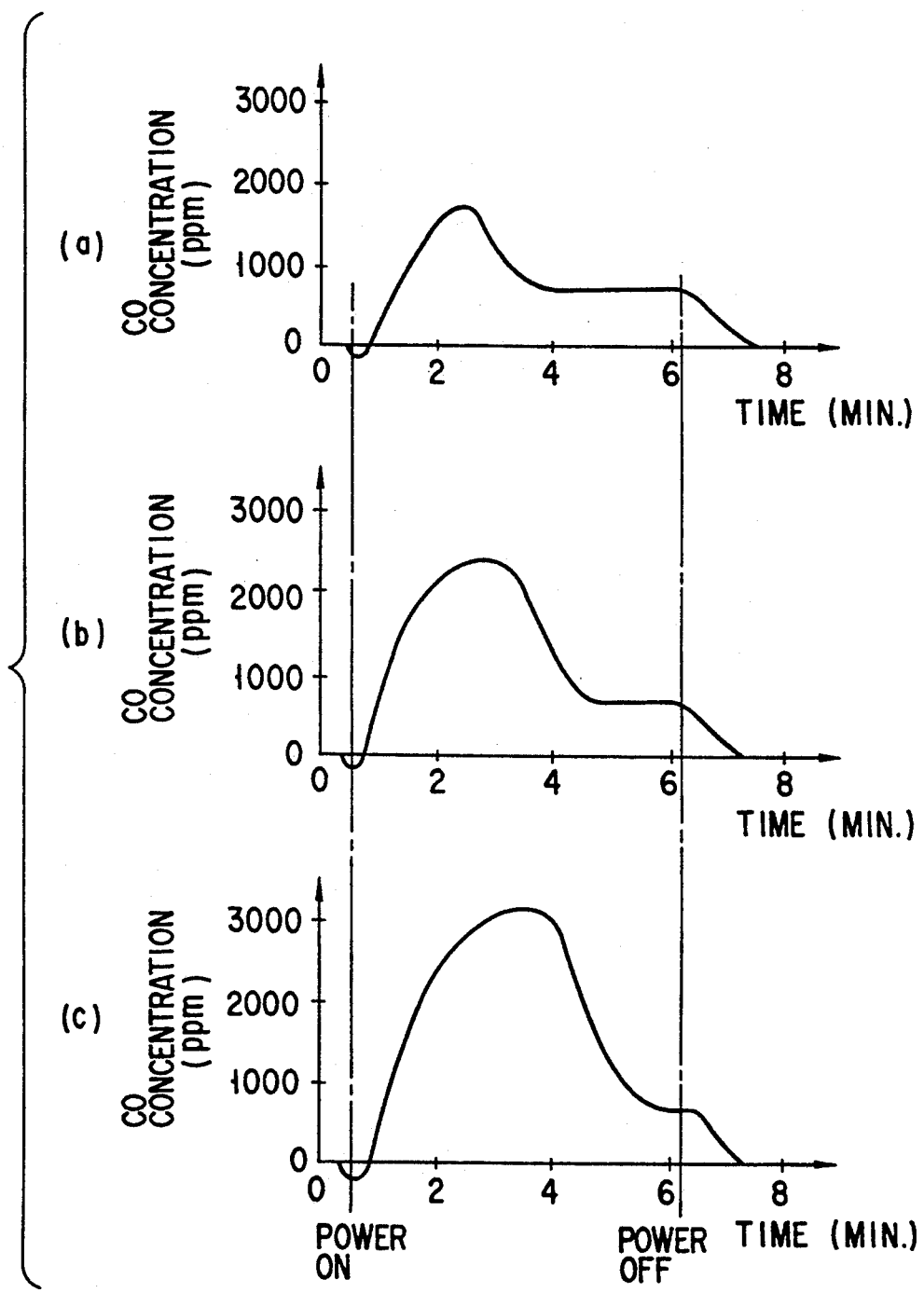
FIG. 4 is a graph indicating changes in CO concentrations during ashing for certain wafer counts.

A result of an experiment conducted for studying the relationship between the CO concentration of the discharge gas and ashing will be described. FIG. 4 shows data of experiments conducted for studying the CO concentration change patterns in units of counts of wafers to be ashed. In FIG. 4, (a) to (c) correspond to cases in which the counts of wafers to be ashed are one, two, and three, respectively. Excluding that, the conditions are the same as those described in the above embodiment. Note that the wavelength (transmitting wavelength of one optical filter F1) for measuring the CO concentration was set to 4.7 $\mu$m and the wavelength (transmitting wavelength of the other optical filter F2) for reference was set to 3.8 $\mu$m.

In these data, the region where the CO gas concentration increases and then decreases in an inverted U shape corresponds to a CO amount obtained by adding the CO generated along with the progress of the resist ashing to the CO contained in the plasma itself. The following region where the CO gas concentration is stabilized corresponds to the CO amount included in the plasma itself. The drift of the 0 point is an influence by $CF_4$. Accordingly, the value obtained by subtracting the stable CO concentration value from the peak value corresponds to the concentration of CO generated by resist ashing. This is supported by the fact that the concentration is increased as the wafer count is increased and that the CO concentration is stabilized at a predetermined value regardless of the wafer count. As a result, the time point when the CO concentration reaches the predetermined value corresponds to an end point of ashing. If this value is obtained in advance, the end point of ashing can be detected by monitoring the CO concentration in the discharge gas.

The location to place the wafers in the reaction chamber 5 was changed among the top, central, and bottom portions, and the pitch of the wafers was changed among various values, thereby obtaining the weight of the ashed product per wafer from an integral of the CO concentration change pattern. No difference was found in any case. Thus, according to the method of the present invention, the ashing end point can be detected regardless of the location of the wafers.

The present invention can also be applied to detect an etching end point. More specifically, when, e.g., a polysilicon film is etched by a plasma, $SiF_4$ or CO is generated by a chemical reaction of the plasma component with the polysilicon. Thus, the etching end point can be detected by monitoring a change in concentration of the generated gas, e.g., $SiF_4$. In this case, a $SiF_4$ monitor may be used in step of the CO monitor 3.

Figure 5:
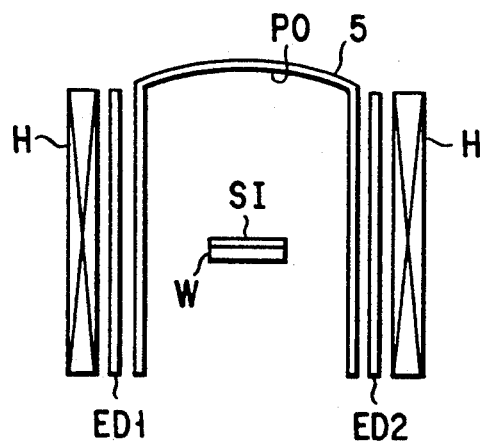
FIG. 5 is a view showing a plasma surface-process apparatus according to another embodiment of the present invention.

This method can also be applied to a case in which an $SiO_2$ film is etched. In this case, a heater H is provided outside electrodes ED1 and ED2 a shown in FIG. 5, and the interior of a reaction chamber 5 is heated by the heater H to deposit a polysilicon layer PO on the inner wall of the reaction chamber 5 by the CVD method. Then, when an $SiO_2$ film SI on a semiconductor wafer W is etched, the end point of $SiO_2$ layer etching can be correctly detected without simultaneously etching the reaction chamber 5 made of quartz ($SiO_2$). Versatility of the apparatus is thus increased. The polysilicon layer P is removed by etching the $SiO_2$ layer.

The method of the present invention which monitors the concentration of the generated gas contained in the discharge gas can also be applied for monitoring the state of the plasma surface-process apparatus. More specifically, when the apparatus is in an abnormal state, the concentration change pattern of the generated gas in ashing or etching differs from that in the normal state since the state of the plasma is changed. Similarly, if a plasma is simply generated without loading wafers, the concentration of a generated gas is changed since this is an abnormal state. When such a concentration change pattern or the gas concentration upon simple generation of the plasma is compared with data in the normal state, the state of the apparatus can be obtained.

Figure 6:
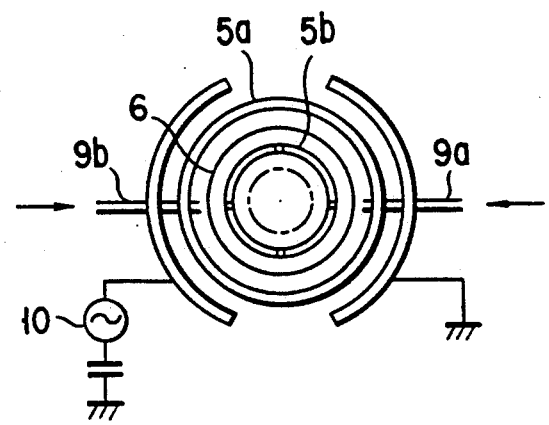
FIG. 6 is a view showing a plasma surface-process apparatus according to still another embodiment of the present invention.

In this case, it is very effective to generate the plasma before loading the semiconductor wafers and monitor the generated gas concentration because the state of the apparatus can be obtained in advance without actually processing the wafers. Two types of surface-process apparatuses were used and the CO concentrations of the discharge gas were measured in units of apparatuses by generating the plasma without loading the wafers in the reaction chamber. One of the two apparatuses had two opposing injectors 9a and 9b, as shown in FIG. 6. This apparatus is obtained by adding one injector to the apparatus shown in FIG. 2. The other of the two apparatuses had four pairs of electrode foils ED3 and ED4 provided outside an outer chamber 5a, as shown in FIG. 7, to generate a plasma across each pair of electrodes ED3 and ED4.

Figure 7:
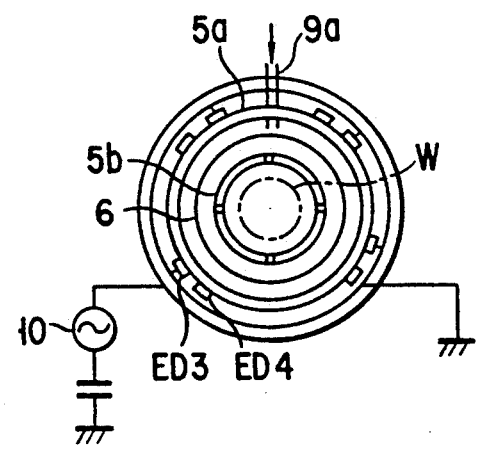
FIG. 7 is a view showing a plasma surface-process apparatus according to still another embodiment of the present invention.

FIGS. 8 and 9 show the measurement results of the CO concentration when the apparatuses of FIGS. 6 and 7, respectively, were used. $CF_4$ and $O_2$ were supplied into each reaction chamber at the flow rates of 160 SCCM and 800 SCCM, respectively. The results indicate the following facts. That is, when the power supply is turned on (when plasma generation is started), the CO concentration is increased to a predetermined value. The CO concentration accompanying the plasma generation takes a specific value, i.e., 860 ppm $\{540-(-320)\}$ in the apparatus of FIG. 6 and 220 ppm $\{(-120)-(-340)\}$ in the apparatus of FIG. 7, although the zero point drifts because of the influence of $CF_4$ in these examples. Referring to FIGS. 8 and 9, reference symbol a denotes a time point when $O_2$ and $CF_4$ are supplied; and b, a time point when the power supply is turned on.

As is apparent from these results, the CO concentration in the discharge gas when the plasma is generated takes a specific value depending on the apparatuses. Therefore, when this value is obtained in advance in units of apparatuses, the state of the apparatus can be obtained by monitoring the CO concentration in the discharge gas.

In the present invention, a gas other than the CO gas in the discharge gas can be measured as a gas generated by ashing or etching, or by plasma generation. When a $CO_2$ concentration change pattern in the discharge gas upon ashing and a $CO_2$ concentration change pattern in the discharge gas upon plasma discharge without loading a wafer were examined by using an infrared ray having a wavelength of 4.3 $\mu$m, the same results as that obtained by monitoring the CO gas in the discharge gas were obtained. To detect, e.g., an etching end point, a generated gas may be selected in accordance with an object to be processed, and the concentration of, e.g., $SiF_4$ in the discharge gas may be monitored.

To monitor the generated gas concentration in the discharge gas, the method is not limited to one utilizing infrared absorption, but can be one utilizing a gas detecting element.

According to the present invention, since the concentration of the gas generated by plasma surface processing is monitored in the discharge gas, the end point of the surface processing, e.g., ashing or etching, can be detected, as is supported by the above embodiments. The gas concentration detection can be performed in an easier operation at lower cost than those with an optical method. When compared to a method for visually observing the plasma, no experience is needed for determination of the end point, and the determination does not depend on perception, resulting in a reliable determination.

Furthermore, according to the present invention, since the concentration of the gas generated when only the plasma is generated without loading an object to be processed, or the concentration of the gas generated when surface processing is being performed is monitored in the discharge gas, the state of the plasma surface-process apparatus can be obtained as is supported by the embodiments described above. In addition, since the present invention is advantageous compared to the optical method, as described above, and the state of the apparatus can be obtained in advance without actually loading the wafers, the wafers will not be wasted.

Furthermore, according to the present invention, plasma processing itself can be effectively performed.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A plasma-process method, comprising the steps of:
   generating a gas plasma by causing a predetermined gas and a predetermined high-frequency electric field to react with each of the in a processing chamber for housing an object to be processed;
   discharging a gas from said processing chamber while executing plasma processing of the object to be processed by the gas plasma;
   monitoring a concentration of a specific gas component, of gas components contained in the gas discharged from said processing chamber, which is generated by plasma processing of the object to be processed;
   pre-measuring the concentration of the specific gas component unique to a plasma-process apparatus including said processing chamber by executing the generating and discharging steps without housing the object to be processed in said processing chamber; and
   checking a state of said plasma-process apparatus in accordance with a measurement result obtained by executing the pre-measuring step.

2. A method according to claim 1, further comprising the step of:
   detecting an end point of plasma processing in accordance with a monitor result of the concentration of the specific gas component.

3. A method according to claim 1, wherein plasma processing of the object to be processed includes ashing processing of a resist film of a semiconductor wafer.

4. A method according to claim 1, wherein plasma processing of the object to be processed includes etching processing of a deposited film on a semiconductor wafer.

5. A method according to claim 1, wherein the monitoring step of monitoring the specific gas component is executed by a monitor which utilizes infrared absorption.

6. A plasma-process apparatus, comprising:
   plasma generating means for generating a gas plasma by causing a predetermined gas and a predetermined high-frequency electric field to react with each other in a processing chamber for housing an object to be processed;
   discharging means for discharging a gas from said processing chamber while executing plasma processing of the object to be processed by the gas plasma generated by said plasma generating means; and
   monitoring means for monitoring a concentration of a specific gas component, of gas components contained in the gas discharged from said processing chamber by said discharging means, which is generated by plasma processing of the object to be processed;
   wherein said monitoring means includes a monitor utilizing infrared absorption and said monitor includes a first detecting section for obtaining an output corresponding to a change in concentration of the specific gas component, a second detecting section for obtaining an output which is not related to the change in concentration of the specific gas component, and a signal processing section for obtaining a difference between the outputs from said first and second detecting sections.

7. An apparatus according to claim 6, further comprising end point detecting means for detecting an end point of plasma processing in accordance with a monitor result of the concentration of the specific gas component obtained by said monitoring means.

8. An apparatus according to claim 6, wherein said discharging means includes a vacuum dry pump.

9. A plasma-process apparatus, comprising:
   a processing chamber having a double structure of outer tube and inner tube having open ends corresponding to each other, said inner tube having a multiple of holes formed at a plurality of positions of said inner tube, and said processing chamber being provided with an etch tunnel member which covers an outer circumferential surface of said inner tube and which has a multiple of holes formed at positions offset from the positions of said multiple of holes formed in said inner tube;
   manifold means for holding the open ends of said outer tube and said inner tube of said processing chamber and a housing member for an object to be processed which is to be inserted in said inner tube, said manifold means being provided with discharging means for discharging a gas from said processing chamber;
   injector means for supplying a gas for plasma generation between said outer tube and said inner tube of said processing chamber;
   a pair of electrode means, provided to surround an outer circumference of said outer tube of said processing chamber, for generating a gas plasma by causing a predetermined high-frequency electric field to react with the gas for plasma generation which is supplied between said outer tube and said inner tube, thereby inducing plasma processing of the object to be processed which is inserted in said inner tube; and
   monitoring means for monitoring a state of progress of plasma processing of the object to be processed in relation to plasma processing.

10. An apparatus according to claim 9, further comprising end point detecting means for detecting an end point of plasma processing in accordance with a monitor result of the concentration of a specific gas component obtained by said monitoring means.

11. An apparatus according to claim 9, wherein plasma processing of the object to be processed includes ashing processing of a resist film on a semiconductor wafer.

12. An apparatus according to claim 9, wherein plasma processing of the object to be processed includes etching processing of a deposited film on a semiconductor wafer.

13. An apparatus according to claim 9, wherein said monitoring means includes a monitor utilizing infrared absorption.

14. An apparatus according to claim 9, wherein said monitor includes a first detecting section for obtaining an output corresponding to a change in concentration of a specific gas component, a second detecting section for obtaining an output which is not related to the change in concentration of the specific gas component, and a signal processing section for obtaining a difference between the outputs from said first and second detecting sections.

15. An apparatus according to claim 9, wherein said discharging means includes a vacuum dry pump.

* * * * *